(12) United States Patent
Nguyen et al.

(10) Patent No.: US 10,546,914 B1
(45) Date of Patent: Jan. 28, 2020

(54) SYSTEMS AND METHODS FOR AN INDUCTOR STRUCTURE HAVING AN UNCONVENTIONAL TURN-RATIO IN INTEGRATED CIRCUITS

(71) Applicant: MARVELL INTERNATIONAL LTD., Hamilton (BM)

(72) Inventors: Huy Thong Nguyen, Singapore (SG); Poh Boon Leong, Cupertino, CA (US); Juan Xie, Singapore (SG)

(73) Assignee: Marvell International Ltd., Hamilton (BM)

( * ) Notice: Subject to any disclaimer, the term of this patent is extended or adjusted under 35 U.S.C. 154(b) by 0 days.

(21) Appl. No.: 15/469,355

(22) Filed: Mar. 24, 2017

Related U.S. Application Data

(60) Provisional application No. 62/312,865, filed on Mar. 24, 2016.

(51) Int. Cl.
| | |
|---|---|
| H01F 5/00 | (2006.01) |
| H01L 49/02 | (2006.01) |
| H01L 21/3205 | (2006.01) |
| H01L 23/66 | (2006.01) |
| H01L 21/66 | (2006.01) |
| H03H 1/00 | (2006.01) |
| H03H 7/42 | (2006.01) |
| H01F 27/28 | (2006.01) |
| H01F 41/04 | (2006.01) |
| H01F 27/29 | (2006.01) |

(52) U.S. Cl.
CPC ......... *H01L 28/10* (2013.01); *H01F 27/2804* (2013.01); *H01F 27/29* (2013.01); *H01F 41/041* (2013.01); *H01L 21/32051* (2013.01); *H01L 22/14* (2013.01); *H01L 23/66* (2013.01); *H03H 1/00* (2013.01); *H03H 7/42* (2013.01); *H01L 2223/6672* (2013.01); *H03H 2001/0078* (2013.01)

(58) Field of Classification Search
USPC .............................. 336/200, 232, 234, 192
See application file for complete search history.

(56) References Cited

U.S. PATENT DOCUMENTS

| | | | |
|---|---|---|---|
| 2003/0179067 A1* | 9/2003 | Gamou | H01F 27/2804 336/223 |
| 2009/0315662 A1* | 12/2009 | Hijioka | H01F 17/0013 336/200 |
| 2014/0218153 A1* | 8/2014 | Chen | H01F 19/08 336/173 |

* cited by examiner

*Primary Examiner* — Elvin G Enad
*Assistant Examiner* — Kazi S Hossain

(57) ABSTRACT

Embodiments described herein provide circuitry employing one or more inductors having an unconventional turn-ratio. The circuitry includes a primary inductor having a first length located on a first layer of an integrated circuit (IC). The circuitry further includes a secondary inductor having a second length located on a second layer of the IC different from the first layer, whereby the second length is greater than the first length, with a ratio between the first and the second lengths corresponding to a non-integer turn-ratio.

10 Claims, 10 Drawing Sheets

SYSTEMS AND METHODS FOR AN INDUCTOR STRUCTURE HAVING AN UNCONVENTIONAL TURN-RATIO IN INTEGRATED CIRCUITS

CROSS-REFERENCE TO RELATED APPLICATION

This application claims the benefit under 35 U.S.C. § 119(e) of U.S. Provisional Patent Application No. 62/312,865, filed Mar. 24, 2016, which is hereby incorporated by reference herein in its entirety.

FIELD OF USE

This disclosure relates to an inductor-based structure for use in integrated circuits (ICs), and specifically, an inductor-based structure with unconventional (and usually non-integer) turn-ratios.

BACKGROUND OF THE DISCLOSURE

The background description provided herein is for the purpose of generally presenting the context of the disclosure. Work of the inventors hereof, to the extent the work is described in this background section, as well as aspects of the description that do not otherwise qualify as prior art at the time of filing, are neither expressly nor impliedly admitted to be prior art against the present disclosure.

An inductor, which usually takes the form of a coil, is an electrical and electronic component that stores energy in a magnetic field when an electric current flows through it. A radiofrequency (RF) inductor, i.e., an inductor that is optimized to operate under alternating current at high frequencies, is an important component for RF oscillators, amplifiers, filters, and the like. Existing RF inductors in ICs generally have smaller footprints than stand-alone inductor units and usually have limited, integer-based turn-ratios.

SUMMARY

Embodiments described herein provide an IC employing a pair of inductors having a non-integer turn-ratio. The pair of inductors includes a primary inductor having a first length located on a first layer of the IC. The pair of inductors further includes a secondary inductor having a second length located on a second layer of the IC different from the first layer. The second length of the secondary inductor is greater than the first length of the primary inductor, and a ratio between the first and second lengths correspond to the non-integer turn-ratio of the pair of inductors.

In some embodiments, the primary inductor is confined within a perimeter on the first layer and the second inductor is confined within the same perimeter on the second layer.

In some embodiments, the secondary inductor includes two overlapping arms separated by one or more transient gaps.

In some embodiments, a length of the one or more transient gaps between the two overlapping arms of the secondary inductor divided by the first length of the primary inductor corresponds to a transient gap fraction of the secondary inductor.

In some embodiments, the primary inductor has a first width. The two overlapping arms of the secondary inductor has a second width and a third width respectively that are less than the first width.

In some embodiments, at least one of the one or more transient gaps has a fourth width. The first width is equal to the sum of the second, the third, and the fourth widths.

In some embodiments, the secondary inductor includes a first plurality of N conductors and a second plurality of N+1 conductors interconnected with conductor wires.

In some embodiments, the non-integer turn-ratio of the pair of inductors is 1:m and the non-integer turn-ratio can be selected by fine-tuning a transient gap fraction of the secondary inductor, where $N<m<N+1$.

In some embodiments, the primary inductor receives a pair of balanced signal inputs, and wherein the secondary inductor generates an unbalanced output.

In some embodiments, the pair of inductors further includes another primary inductor located on the first layer in addition to the primary inductor. The two primary inductors each receive a pair of inputs. The secondary inductor combines the pairs of inputs from the two primary inductors and generates a pair of outputs, which is proportional to the combined pairs of inputs Embodiments described herein include a method for forming a pair of inductors having a non-integer turn-ratio on an IC. A primary inductor having a first length is formed on a first layer of the IC. A second length of a secondary inductor is selected, the second length being greater than the first length, such that a ratio between the first and the second lengths is a non-integer. The secondary inductor having the second length is then formed on a second layer of the IC different from the first layer.

BRIEF DESCRIPTION OF THE DRAWINGS

Further features of the disclosure, its nature and various advantages will become apparent upon consideration of the following detailed description, taken in conjunction with the accompanying drawings, in which like reference characters refer to like parts throughout, and in which.

DETAILED DESCRIPTION

This disclosure describes methods and systems for providing an inductor structure that allows enhanced area usage on a circuit. The term "circuit" is used throughout this disclosure to include, but is not limited to, an integrated circuit disposed on a semiconductor material such as silicon, a circuit disposed on a printed circuit board (PCB), and/or the like. The term "forming," "formed," "form," "disposing," "disposed," "dispose," "depositing," "deposited," or "deposit" is used throughout this disclosure to indicate, but is not limited to, placing, fixing, arranging in a particular position, and/or the like. The term "configuring" or "configured" is used throughout this disclosure to indicate, but is not limited to, placing one or more items together in a particular form or configuration, arranging or ordering one or more items at a particular location so as to fit the one or more items for a designated task, and/or the like.

Figure 1C:
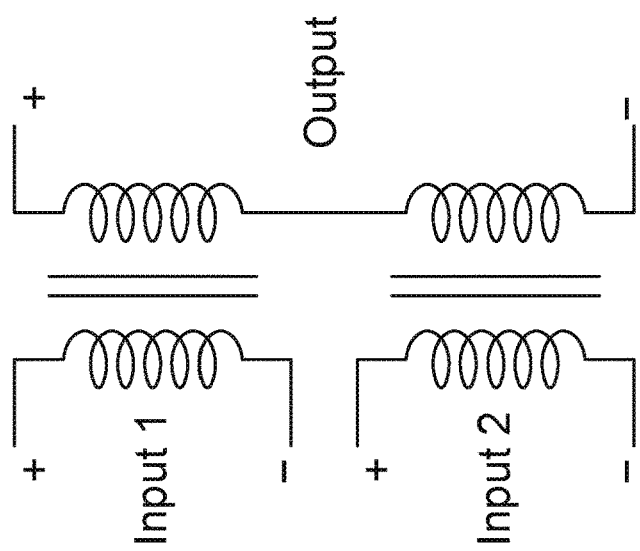
FIGS. 1A-1C are schematic diagrams of example inductor structures according to some embodiments described herein.
Figure 1B:
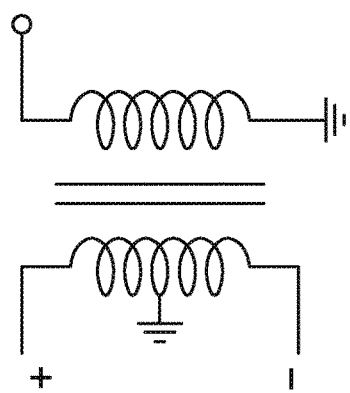
Figure 1A:
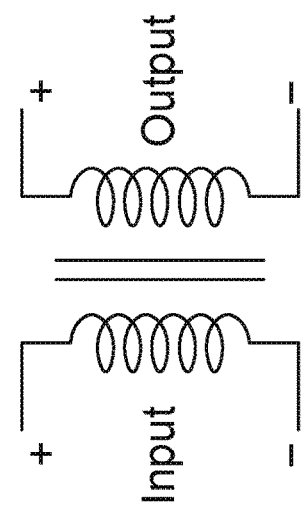

Existing inductor structures, such as transformers, baluns, and power combiners, usually have one or more inductor coils placed in proximity with each other. These inductor structures are essential components of radio frequency integrated circuit (RFIC) designs. FIGS. 1A-1C are schematic diagrams of example inductor structures. FIG. 1A is an example of a transformer with a pair of inductor coils connected to an input and an output, respectively. During operation, the power and/or impedance at the input of the transformer is transferred to the output of the transformer. In particular, the impedance transformation of the transformer follows the turn-ratio of the transformer. FIG. 1B is an example of a balun, in which a pair of balanced signals at the input is transferred to an unbalanced signal at the output, or vice versa. The transformation could go in both directions. FIG. 1C is an example of a power combiner, in which the power and/or impedance at both input 1 and input 2 are combined and transferred to the single output of the power combiner.

While inductor structures, such as those shown in FIGS. 1A-1C, typically are implemented as stand-alone passive components used in various electrical and electronic devices, they have only been implemented in ICs in recent years. Moreover, the turn-ratios of these inductor structures are usually small and conventional integer ratios, such as 1:2. Recent developments in RFIC designs demand unconventional turn-ratios to be implemented within a limited footprint (or perimeter) on an IC, such as 1:18, 1:85, or 1:2.3, among others. Accordingly, in embodiments of the present disclosure, IC-level design of RF inductor structures and methods are provided to fine-tune inductor topologies to achieve unconventional turn-ratios, while maintaining traditional performance metrics, such as low insertion loss.

Figure 2:
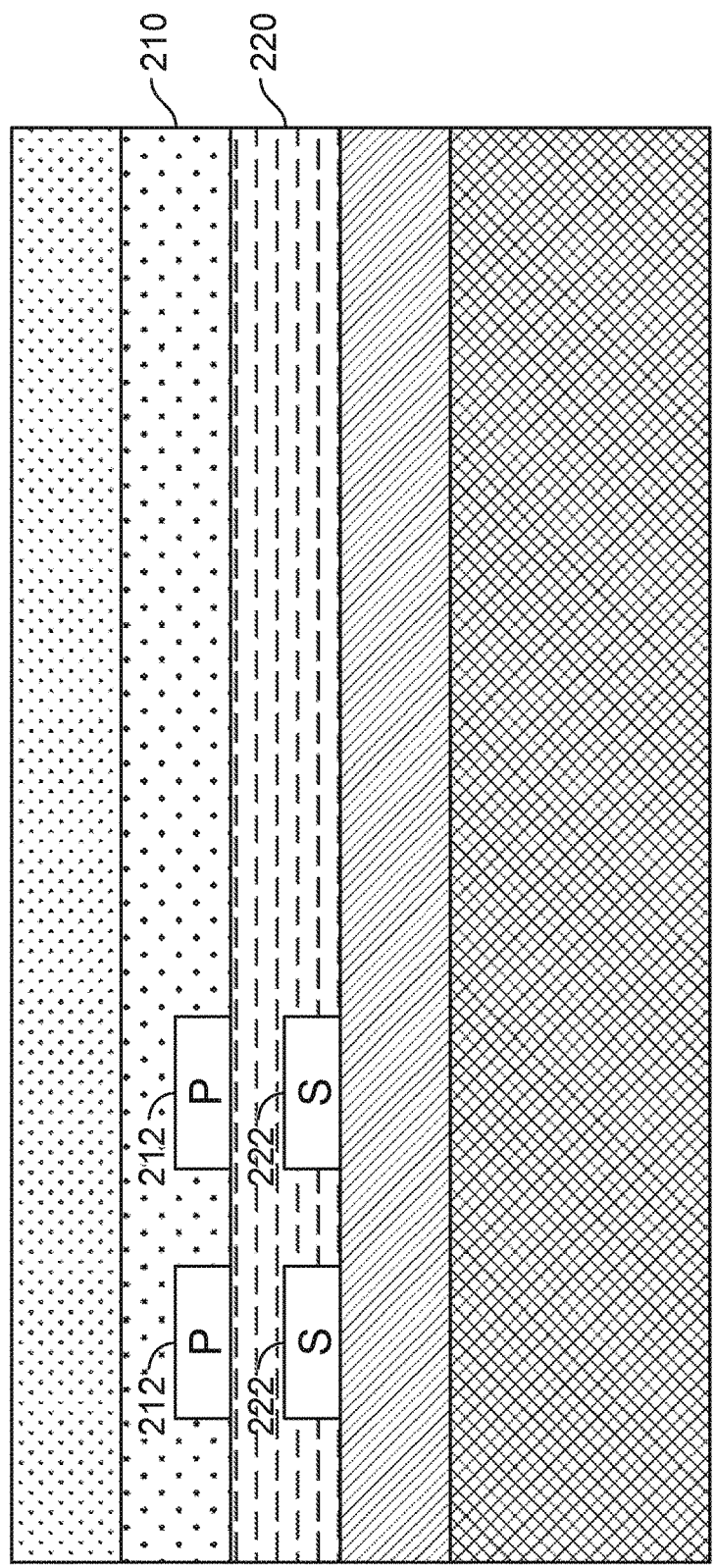
FIG. 2 is a schematic diagram illustrating an example IC with primary and secondary inductors located on different layers, according to some embodiments described herein.

FIG. 2 shows a schematic diagram illustrating an example of an IC with primary and secondary inductors located on different layers in accordance with some embodiments of the present disclosure. The IC seen in FIG. 2 employs multiple layers of silicon (or one or more of other semiconductor materials) in a planar, stacked design, including first layer 210 and second layer 220. One or more primary inductors 212 are formed within first layer 210; and one or more secondary inductors 222 are formed within second layer 220. The primary inductors 212 and the secondary inductors 222 are substantially confined within the same perimeter of each other, such that they have high mutual inductance, or coupling factor, within the IC.

Although the illustrative example shown in FIG. 2 depicts first layer 210 to be located above second layer 220, it is noted that the relative positions of first layer 210 and second layer 220 are not limiting to the present disclosure, and that the layers can be re-arranged in any suitable manner so long as primary inductors 212 and secondary inductors 222 are in proximity to each other to operate as a transformer, a balun, a power combiner, or any other suitable inductor-based circuit component. In some embodiments, the IC shown in FIG. 2 suitably is a wireless transceiver IC that employs inductors as part of an RLC circuit.

Figure 3:
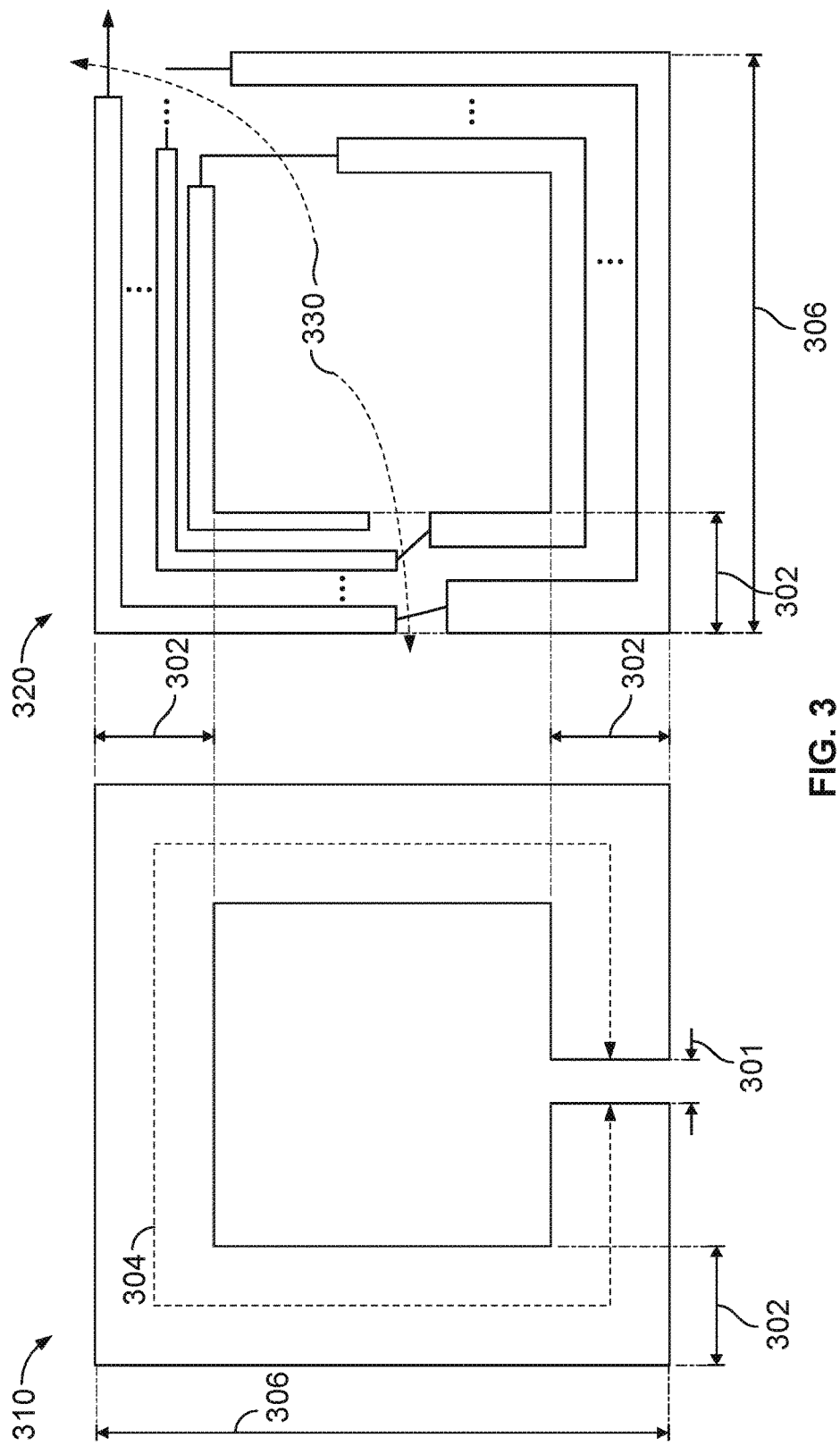
FIG. 3 is a schematic diagram of an example RF inductor on an IC, according to some embodiments described herein.

FIG. 3 shows a schematic diagram of an RF inductor example disposed on an IC in accordance with some embodiments of the present disclosure. The RF inductor seen in FIG. 3 is depicted in the dual-inductor configuration that is suitably implemented as either a transformer, a balun, or as part of a power combiner. It is noted that the illustration in FIG. 3, as well as the subsequent figures in the present disclosure is applicable to any and all inductor-based designs on RFICs requiring unconventional turn-ratios, and is not limited to inductors having the specific turn-ratio configurations seen in the figures.

The inductor structure example seen in FIG. 3 includes primary inductor 310 and secondary inductor 320. In some embodiments, primary inductor 310 is confined within a perimeter of first layer 210, whereby the perimeter is defined by a semi-enclosed square conductor stripe with a conductor width 302 (denoted by "W" herein, also referred to as "first width") and a conductor length 304 (also referred to as "first length" herein). In some embodiments, the perimeter for primary inductor 310 is defined by four outer side lengths 306 (denoted by "L" herein) forming a square. In some embodiments, conductor width 302 of primary inductor 310 is uniform throughout conductor length 304. As noted previously, in some embodiments, secondary inductor 320 is confined substantially within the same perimeter, as defined by the perimeter of primary inductor 310, but in second layer 220. The same perimeter is also defined by four outer side lengths 306 forming the square.

Second layer 220, on which secondary inductor 320 is formed, is located either above or below first layer 210, such that secondary inductor 320 is either directly above or directly below primary inductor 310. In some embodiments, primary inductor 310 and secondary inductor 320 may overlap with each other with an offset, such that the two inductors are not completely confined within the same perimeter. Generally, the amount of overlap between primary inductor 310 and secondary inductor 320 corresponds to the level of mutual inductance between the pair of inductors.

Secondary inductor 320 includes a plurality of conductor stripes arranged within the same perimeter as defined by the perimeter of primary inductor 310. In some embodiments, the plurality of conductor stripes include top conductor stripes 1, 2, . . . , N, and N+1; as well as bottom conductor stripes 1, . . . , N. In some embodiments, in secondary inductor 320, some conductor stripes of the plurality of conductor stripes have different widths from each other. In some embodiments, the sum of the respective widths of the conductor stripes is substantially the same as first width 302. In some other embodiments, the sum of the respective widths of the conductor stripes and the widths of gaps therein (e.g., transient gap 330 as discussed below) is substantially the same as first width 302. Some or all of the plurality of conductor stripes of secondary inductor 320 are connected via conductor wires, in some embodiments, such that the total length of secondary inductor 320, when each and every one of the conductor stripes are linked together, is greater than first length 304.

The form and shape of primary inductor 310 (i.e., a semi-enclosed square stripe) and secondary inductor 320 (i.e., one or more turns of conductor stripes interconnected with conductor wires) are illustrative in nature and non-limiting. It is noted that consistent with the present disclosure, the pair of primary and secondary inductors can operate in any form, shape, or configuration so long as they are in proximity with each other and exhibit strong mutual inductance. For example, the perimeter for each inductor can be shaped as any enclosed or semi-enclosed polygon, circle, or an irregular shape in accordance with the present disclosure.

Secondary inductor 320 further includes transient gap 330 between one or more overlapping conductor stripes (also referred to as "overlapping arms" of secondary inductor 320) in order to sufficiently delineate the boundaries of two nearby conductor stripes. Transient gap 330 further helps ensure that the conductor stripes are formed on the semiconductor substrate in accordance with proper design rules during manufacturing. The width of a conductor stripe, at any point along its length, should always exceed a predetermined minimum dimension on each semiconductor layer. For instance, extremely thin conductor stripes (i.e., those that do not exceed the predetermined minimum dimension) of an inductor tend to create excessive resistance in the component, thereby causing performance issues such as low quality factors (or "Q factors"). In the design examples of secondary inductor 320 discussed herein, transient gap 330 is described by its length (i.e., the transient gap length) and its width (also referred to as "conductor spacing", as denoted by S). The width of transient gap 330 is further illustrated below in relation to FIGS. 4 and 5 as width 408, and width 508, respectively. In some embodiments, the transient gap length is not greater than the total length of the perimeter of secondary inductor 320. For example, for a given length L of each outer side 306, in some embodiments, the length of transient gap 330 is not greater than 4 L.

Generally, for an inductor on an IC, the transient gap fraction is defined as the fraction represented by the transient gap length relative to the length of the perimeter of secondary inductor 320. In some embodiments, the first length 304 of primary inductor 310 is approximately the perimeter length of secondary inductor 320, i.e., 4L (ignoring the length of opening 301 at the bottom of primary inductor 310). Accordingly, the transient gap fraction can sometimes be approximated by the length of transient gap 330 divided by first length 304. However, in precise calculations, the transient gap fraction is defined as the fraction represented by the length of the transient gap relative to the length of the inductor perimeter.

Another parameter of the dual-inductor configuration is the coupling factor, which generally measures the amount of mutual inductance between the two inductors. A higher coupling factor indicates more flux generated by the transmitting inductor penetrates the receiving inductor.

The turn-ratio of a pair of inductors, such as those shown in FIG. 3, is generally proportional to the relative lengths of the pair of inductors when the diameters of each loop (of the inductors) are identical. In some embodiments, primary inductor 310 is substantially confined within the same perimeter as secondary inductor 320, and therefore the loops of both inductors have substantially identical diameters. Accordingly, the ratio between the total inductor length of primary inductor 310 and the total inductor length of secondary inductor 320 corresponds to their turn-ratio.

FIGS. 4-7 show schematic diagrams illustrating RF inductor examples on ICs with various properties and parameters. The schematic designs of FIGS. 4-7 are simulated under a fixed set of parameters, as outlined below and summarized in Table 1.

Figure 4:
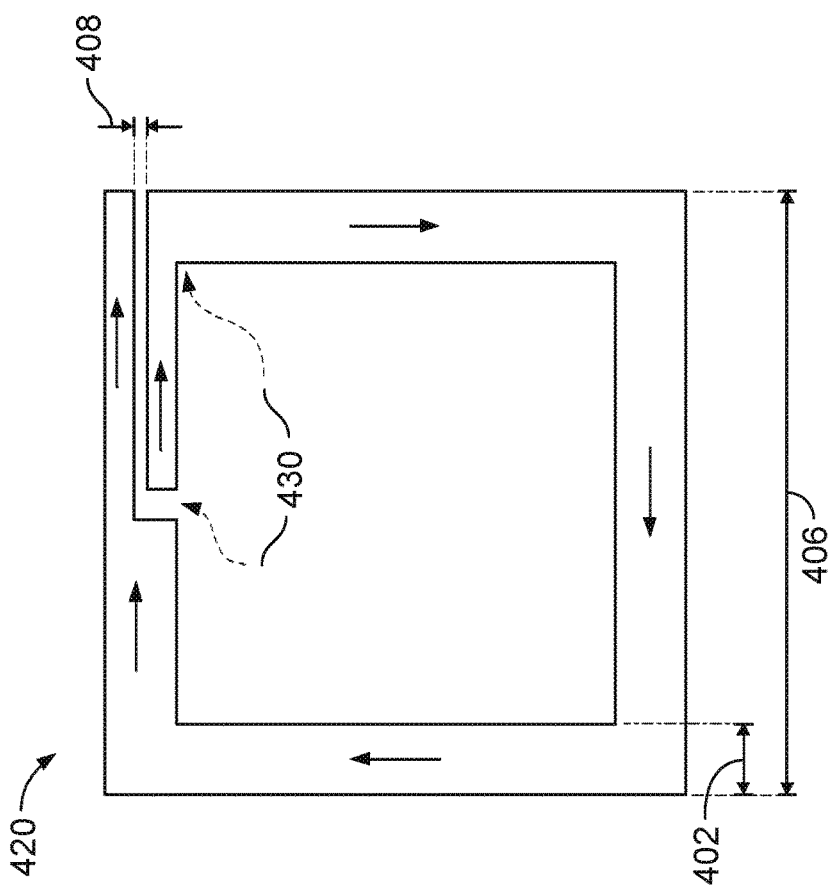
FIG. 4-7 are schematic diagrams illustrating example RF inductors on ICs with various properties, according to some embodiments described herein.
Figure 4:
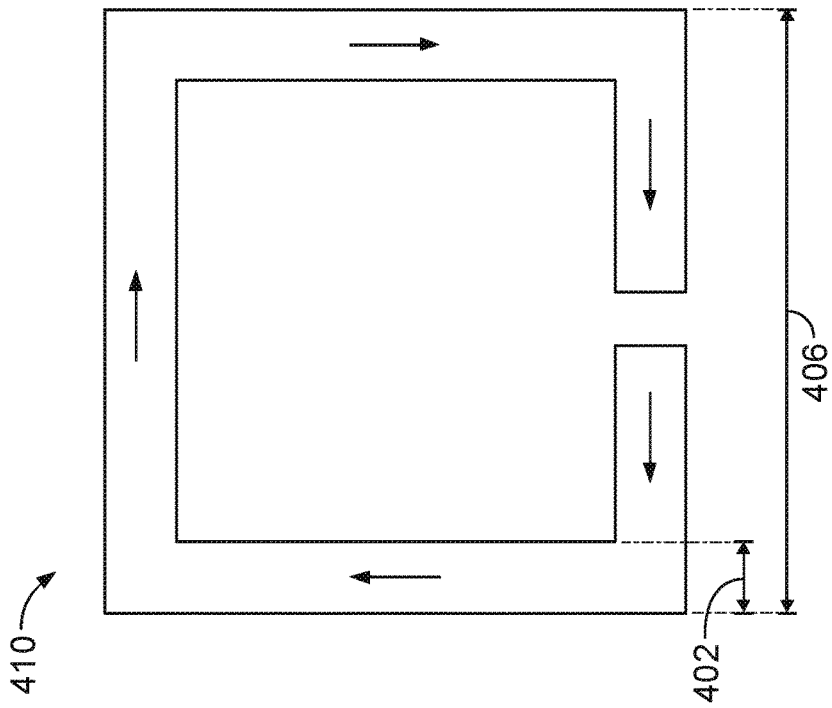

Starting from the pair of inductors in FIG. 4, primary inductor 410 and secondary inductor 420 are generally semi-enclosed square stripes, in which electric currents flow in the direction indicated in the figure. Each outer side 406 of the square perimeter for both inductors 410 and 420 is simulated as being 520 µm (i.e., L=520 µm). The conductor width 402 of primary inductor 410 equals the conductor width of a portion of secondary inductor 420, which is labeled as width 402 as well. During the simulation of the inductors shown in FIG. 4, conductor width 402 is set at 80 m (i.e., W=80 µm).

Secondary inductor 420 further employs transient gap 430 to separate the two arms at each terminus of the inductor stripe. Each of the respective widths of the two arms is a portion of conductor width 402 of the inductor stripe. In some embodiments, the two arms of secondary inductor 420 overlap with each other on a two-dimensional plane within second layer 220, as shown in the example embodiment seen in FIG. 4. In some embodiments, the sum of the widths of the two arms and width 408 of transient gap 430 is equivalent to conductor width 402. As shown in the example embodiment seen in FIG. 4, transient gap 430 is approximately one half the length of outer side 406 (i.e., L/2), or ⅛ the total perimeter length of secondary inductor 420 (i.e., ⅛ of the total perimeter length 4L). Accordingly, the transient gap fraction of secondary inductor 420 is ⅛. In the simulation of the inductors shown in FIG. 4, transient gap width 408 is set at 10 µm (i.e., S=10 µm).

Additional parameters used in the simulation include inductances of primary inductor 410 and secondary inductor 420, which are set at 0.8 nH and 1.1 nH, respectively. The Q factors of the inductors, which measure their respective inductive reactance to resistance at a given frequency, are set to be 20 at 1 GHz. The simulation for the example configuration of primary inductor 410 and secondary inductor 420 as shown in FIG. 4 returns a non-integer turn-ratio of 1.17 and coupling factor of 0.82 between the two inductors.

Figure 5:
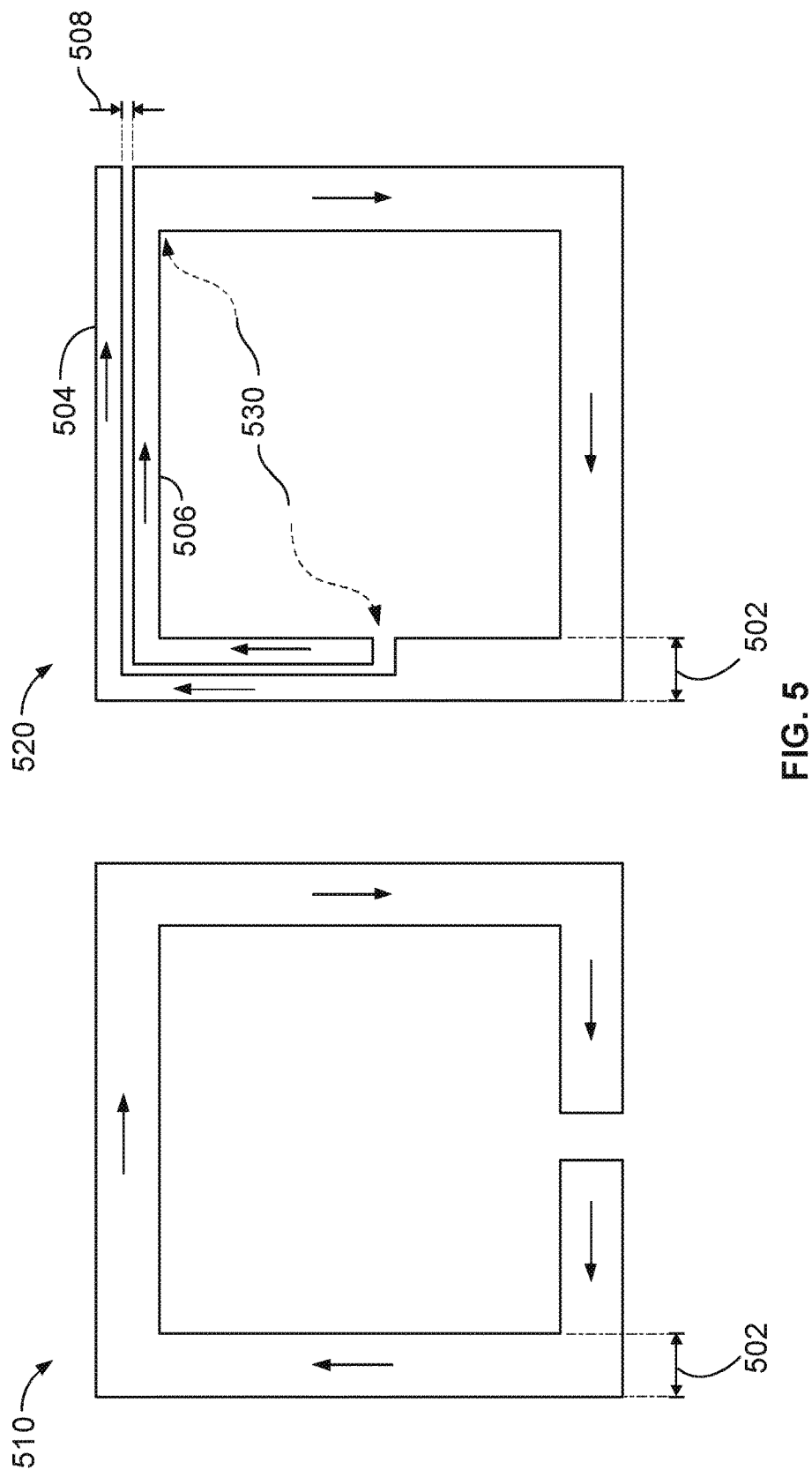

The pair of inductors 510 and 520 in FIG. 5 are configured to be similar to inductors 410 and 420, respectively, with the exceptions that the inductance of secondary inductor is set to be 1.8 nH and that transient gap 530 now runs through ⅜ of the perimeter length of secondary inductor 520. Accordingly, the transient gap fraction is ⅜ in this simulation, which returns a non-integer turn-ratio of 1.5 and a coupling factor of 0.81.

The widths of the two overlapping arms of secondary inductor 520 need not be identical. For example, the width of first arm 504 may be a second width and the width of second arm 506 may be a third width. In some embodiments, each of the second and the third widths is less than the first width 502, which is the width of primary inductor 510. In some embodiments, the sum of the second and the third widths is less than first width 502. In some further embodiments, the width 508 of transient gap 530 may be a fourth width, such that the sum of the second, third, and fourth widths corresponds to the first width 502. Throughout the present disclosure, the above features regarding various widths associated with the inductors are applicable to any and all configurations, including but not limited to those discussed in FIGS. 4-9.

Figure 6:
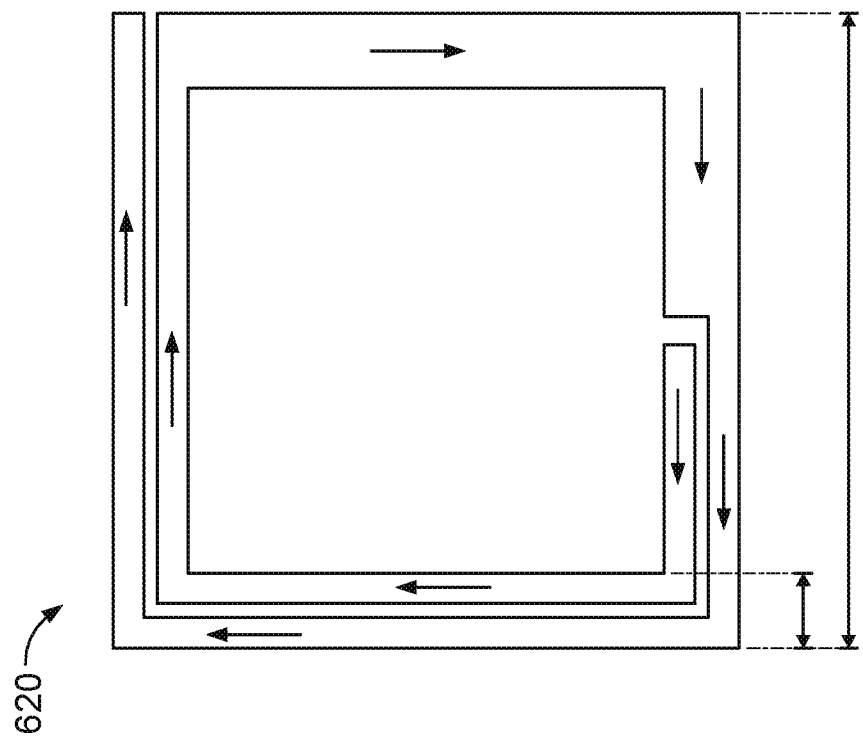
Figure 6:
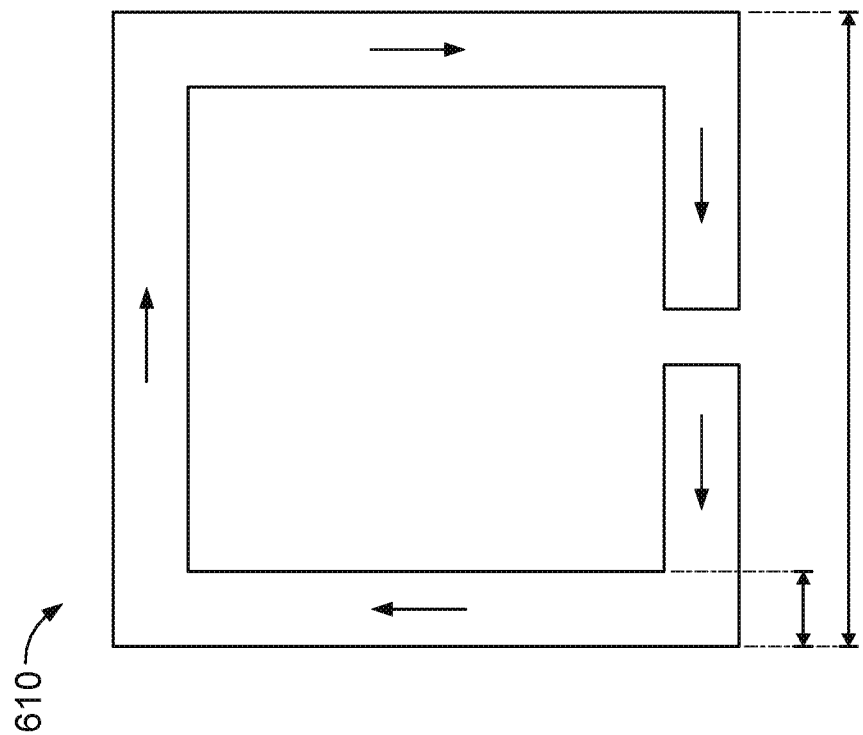
Figure 7:
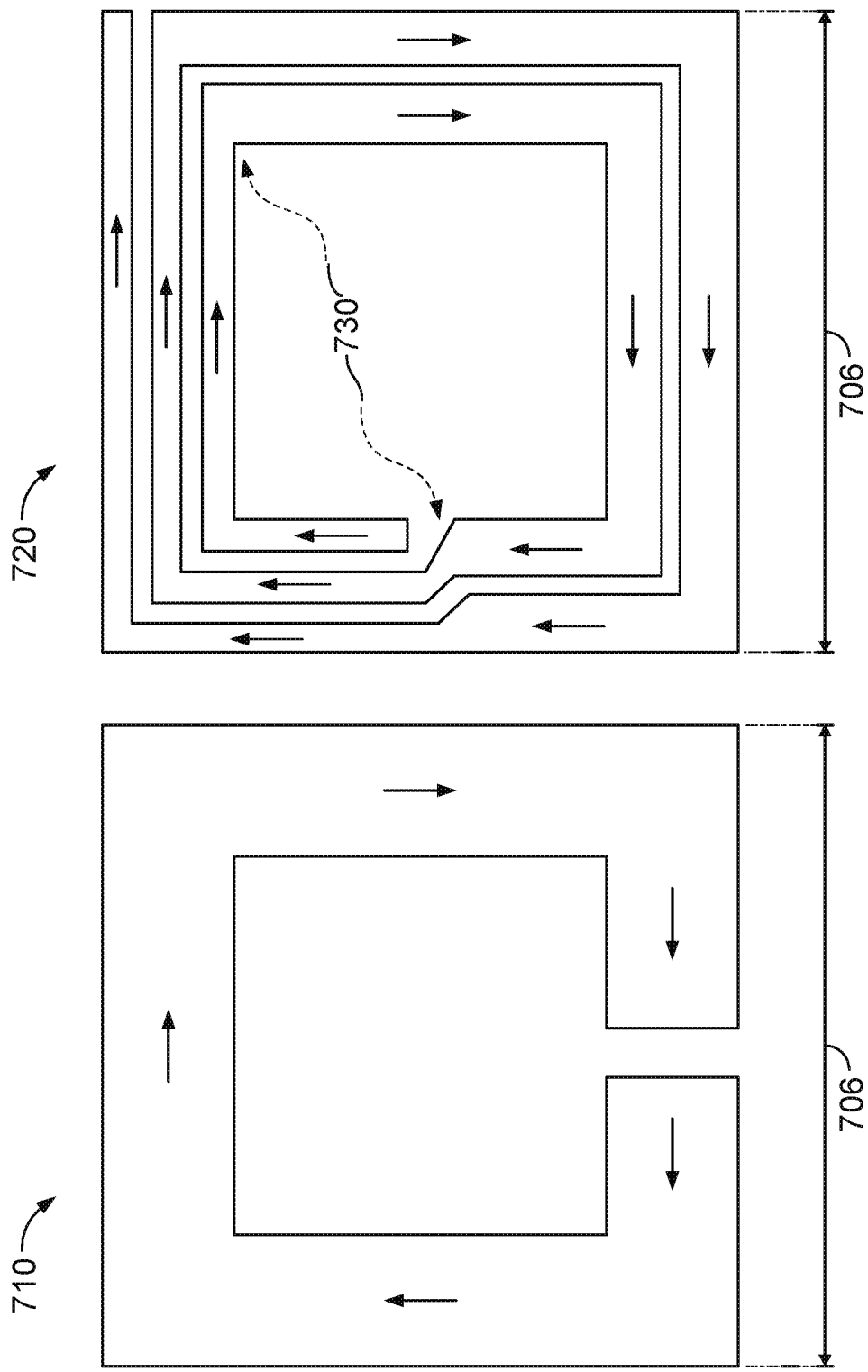

In the embodiments illustrated in FIG. 6, the transient gap fraction is ⅝. Under simulation in which the inductance of primary inductor 610 is 0.8 nH and the inductance of secondary inductor 620 is 2.4 nH, the turn-ratio is 1.73 and the coupling factor is 0.82. In a further example embodiment illustrated in FIG. 7, the transient gap is again approximately ⅜ the length of the perimeter of secondary inductor 720. As noted before, in some embodiments, the length of transient gap 730 is not greater than the length of the perimeter of secondary inductor 720. Therefore, despite the fact that secondary inductor 720 employs two overlapping arms that span multiple rounds of its perimeter, the length of transient gap 330 is ⅜ of the length of the perimeter. Under simulation in FIG. 7, the inductance of primary inductor 710 is presumed to be 0.8 nH and the inductance of secondary inductor 720 is presumed to be 5.0 nH. Accordingly, the turn-ratio is 2.5 and the coupling factor is 0.85. Below is a table that summarizes the simulation parameters and results for each pair of inductors in FIGS. 4-7.

TABLE 1

Simulation parameters and results.

| FIG. | 4 | 5 | 6 | 7 |
|---|---|---|---|---|
| L | 530 μm | 530 μm | 530 μm | 530 μm |
| W | 80 μm | 80 μm | 80 μm | 80 μm |
| S | 10 μm | 10 μm | 10 μm | 10 μm |
| Transient Gap Fraction | 1/8 | 3/8 | 5/8 | 3/8 |
| Primary Inductance | 0.8 nH | 0.8 nH | 0.8 nH | 0.8 nH |
| Secondary Inductance | 1.1 nH | 1.8 nH | 2.4 nH | 5.0 nH |
| Q Factor (@1 GHz) | 20 | 20 | 20 | 20 |
| Turn Ratio | 1.17 | 1.5 | 1.73 | 2.5 |
| Coupling Factor | 0.82 | 0.81 | 0.82 | 0.85 |

The examples shown in FIGS. 4-7 and summarized in Table 1 are illustrative only. It is noted that a turn-ratio between a primary and a secondary inductor in an IC can be selected by changing the transient gap fraction, thereby varying the relative lengths of the inductors. The turn-ratio can be arbitrarily set, either as an integer or as a non-integer ratio. In some embodiments, the inductors are implemented in a planar, stacked design such as that shown in FIG. 2. In some embodiments, the primary inductor (e.g., primary inductor 310) is a single-turn inductor of width W and length P within one layer (e.g., first layer 210). In some further embodiments, the secondary inductor (e.g., secondary inductor 320) is a stacked inductor within the area (or perimeter) of the primary inductor in another layer (e.g., second layer 220). The stacked secondary inductor 320 has multiple parts, in an embodiment. For example, the first part may comprise N+1 conductors, which have a total width of W and a total length of X*P (where X is the transient gap fraction of secondary inductor 320). The second part may comprise N conductors, which have a total width of W and a total length of (1−X)*P. The stacked secondary inductor 320 is formed by interconnecting the first part of N+1 conductors and the second part of N conductors successively. Such a pair of inductors would have a turn-ratio of 1:m, where 1≤N≤m≤N+1.

Various advantages are offered by embodiments of the present disclosure. First, the flexible fine-tuning of transient gap fractions enables the pair of inductors to achieve flexible turn-ratio tuning and flexible impedance-transformation tuning. Second, the primary and secondary inductors are disposed in two adjacent layers of an IC and are configured to overlap each other entirely to produce a strong coupling factor and improved insertion loss performance. Furthermore, in some embodiments, the primary inductor is not limited to being a single-turn inductor. By having multiple turns in both the primary and the secondary inductors, the present disclosure also allows for an even more flexible turn-ratio, i.e., m1:m2, where 1≤m1≤N1+1; and 1≤m2≤N2+1; with N1 and N2 being the number of conductors in the first part of the primary and the secondary inductors, respectively. For example, the turn-ratios achievable by the present disclosure could be 2:3.5, 3.4:4.7, 2:1.2, et cetera.

Figure 8:
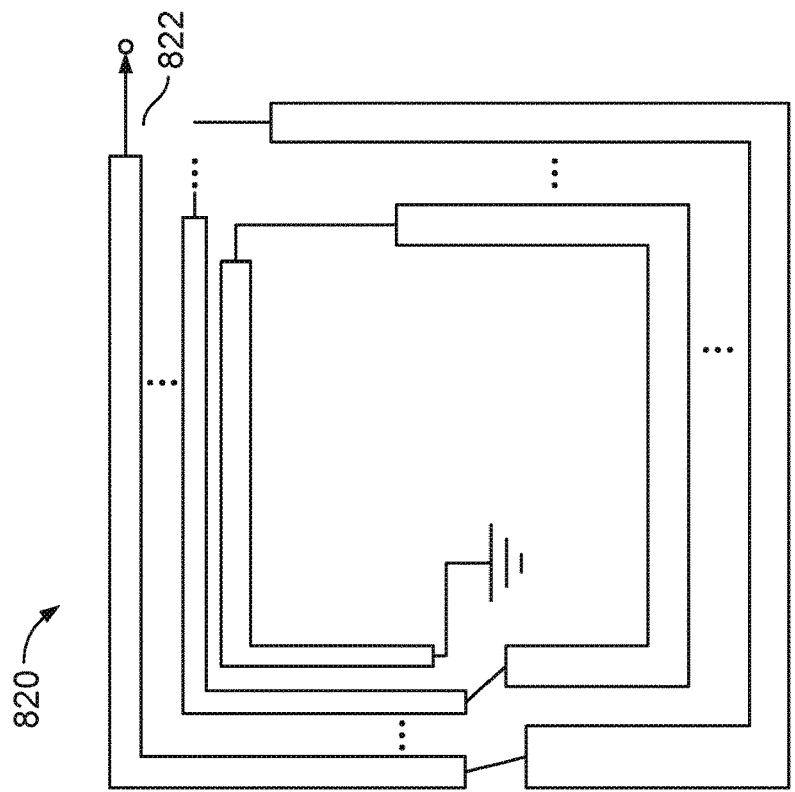
FIG. 8 is a schematic diagram of an example RF balun on an IC, according to some embodiments described herein.
Figure 8:
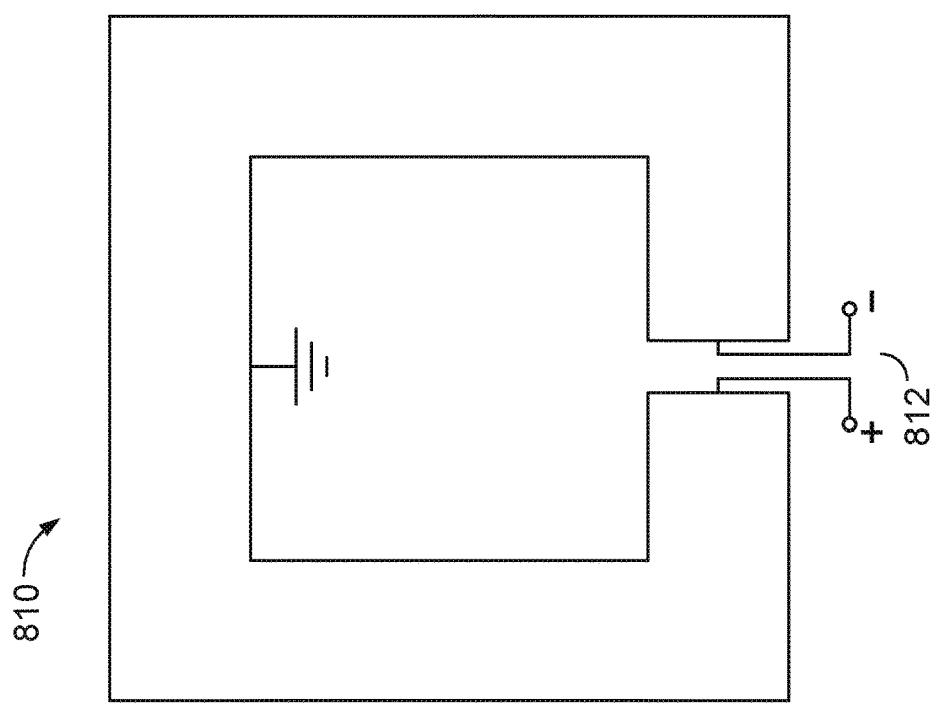

FIG. 8 shows a schematic diagram of an RF balun example disposed on an IC in accordance with some embodiments of the present disclosure. In FIG. 8, primary inductor 810 receives a pair of balanced signals (i.e., a pair of differential signals) at inputs 812 while secondary inductor 820 generates a single unbalanced signal at output 822. Alternatively, in an embodiment, secondary inductor 820 receives a single unbalanced signal at input 822 while primary inductor outputs a pair of balanced signals at output 812. As discussed before, the configuration of primary inductor 810 is not limited to being a single-turn inductor in some embodiments. A flexible turn-ratio can be achieved for a balun application in a similar manner as the transformer applications shown in FIGS. 4-7.

Figure 9:
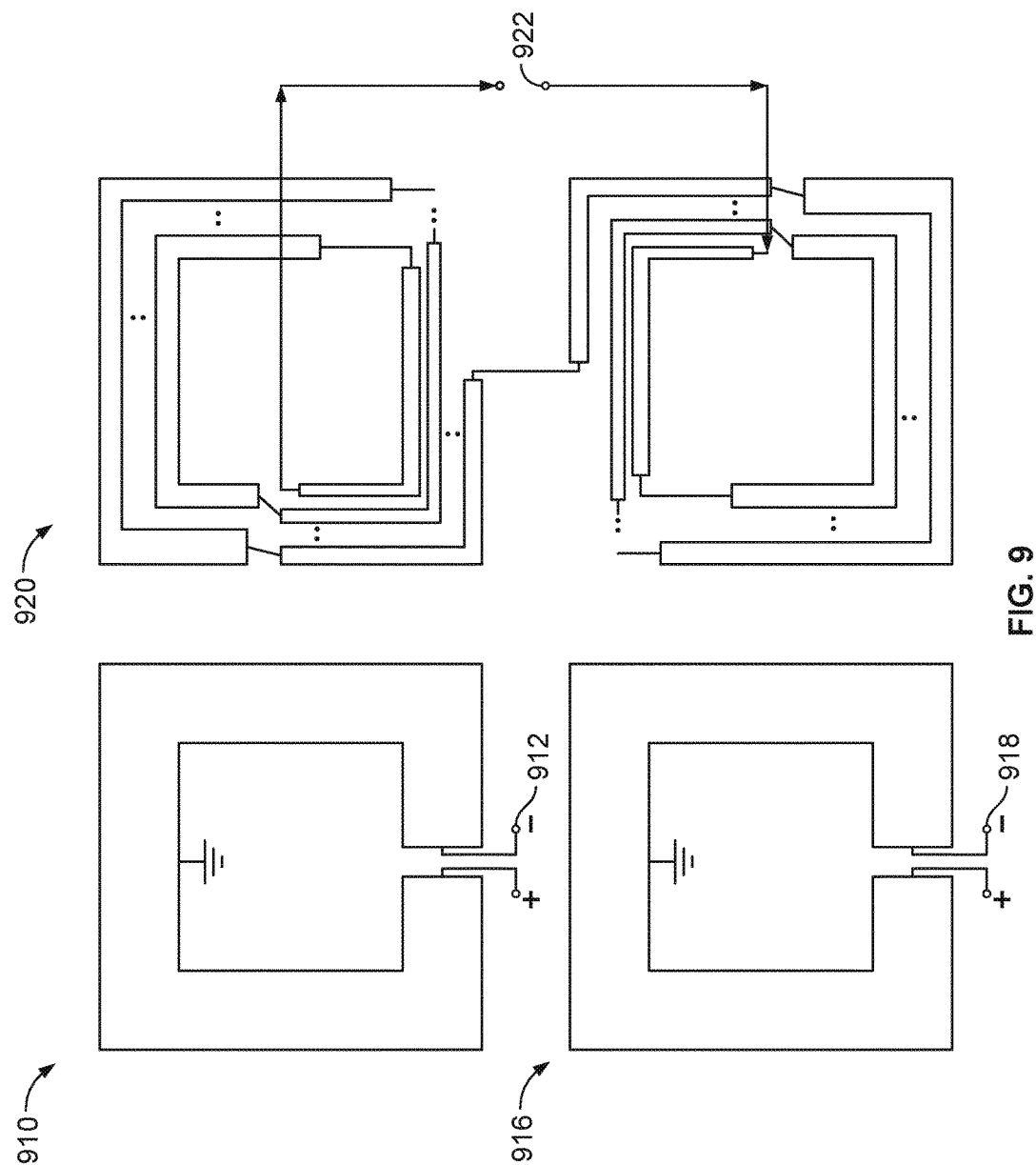
FIG. 9 is a schematic diagram of an example RF power combiner on an IC, according to some embodiments described herein.

FIG. 9 shows a schematic diagram of an RF power combiner example suitably disposed on an IC substrate in accordance with some embodiments of the present disclosure. Primary inductors 910 and 916 each have a pair of balanced inputs: input 912 and input 918, respectively. Secondary inductor 920 is configured in a figure-eight S-shape connection with a single pair of outputs 922. Both primary inductors 910 and 916 are deposited on the same layer of an IC, such as first layer 210, while secondary inductor 920 is deposited on an adjacent layer, such as second layer 220, in an embodiment. In some embodiments, both primary inductors are single-turn inductors. In some other embodiments, either or both primary inductors are multiple-turn inductor(s). The power combiner shown in FIG. 9 suitably combines the power and/or impedance at inputs 912 and 918 at output 922, at a ratio that can be selected based on the techniques discussed above in relation to FIGS. 4-7. While FIG. 9 shows only a single design for a power combiner, it is noted that other suitable power combiner designs employ the techniques described herein.

Figure 10:
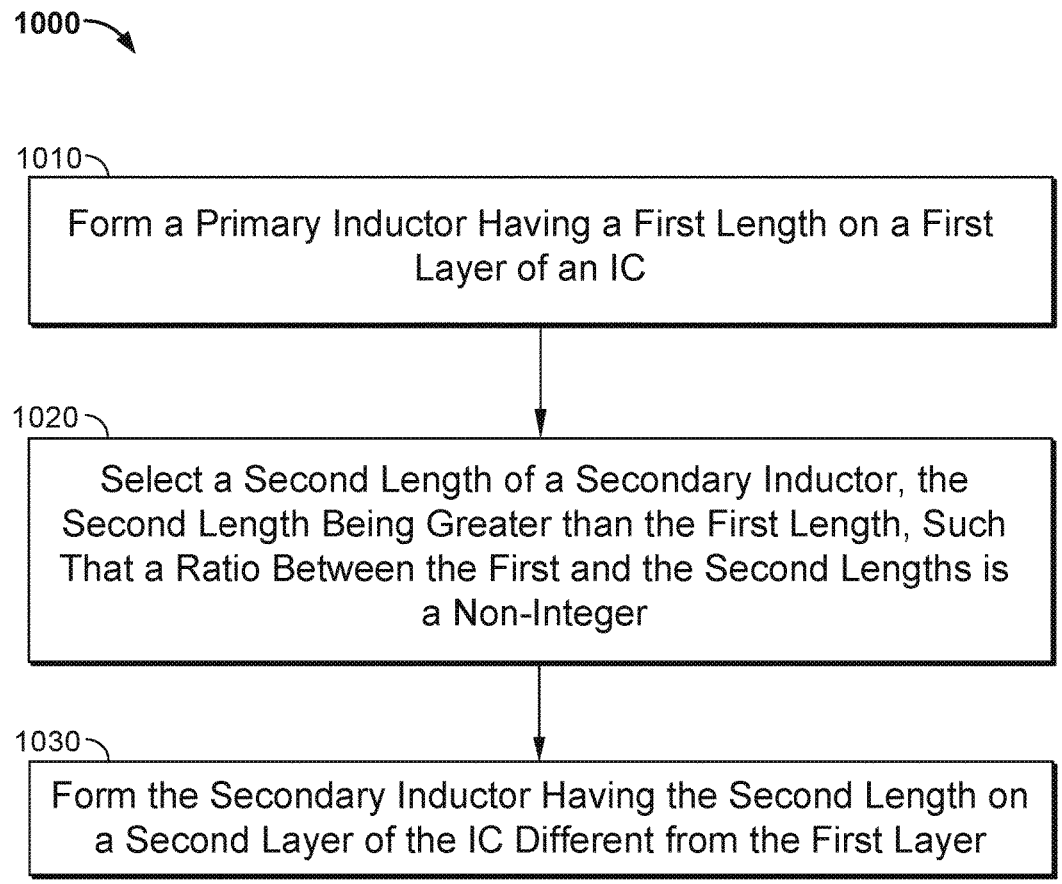
FIG. 10 is an example logic flow diagram illustrating aspects of forming and configuring an inductor structure as described in FIGS. 1-9, according to some embodiments described herein.

FIG. 10 is an example logic flow diagram 1000 illustrating aspects of forming and configuring an inductor structure as described in FIGS. 1-9, in accordance with some embodiments of the present disclosure. At 1010, the systems and apparatus described herein form a primary inductor (e.g., primary inductor 212, 310, 410, 510, 610, 710, 810, 910, or 916) having a first length on a first layer (e.g., first layer 210) of an IC, for example, by using suitable materials deposition and/or patterning techniques. At 1020, the systems and apparatus described herein determine or select a second length of a secondary inductor, where the second length is greater than the first length, such that a ratio between the first and the second lengths is a non-integer ratio. At 1030, the systems and apparatus described herein form the secondary inductor (e.g., secondary inductor 214, 320, 420, 520, 620, 720, 820, or 920) having the second length, on a second layer (e.g., second layer 220) of the IC different from the first layer, for example, using suitable materials deposition and/or patterning techniques. Accordingly, a method for forming a pair of inductors having a non-integer turn-ratio on an integrated circuit is provided.

While various embodiments of the present disclosure have been shown and described herein, such embodiments are provided by way of example only. Numerous variations, changes, and substitutions relating to embodiments described herein are applicable without departing from the disclosure. It is noted that various alternatives to the embodiments of the disclosure described herein may be employed in practicing the disclosure. It is intended that the following claims define the scope of the disclosure and that methods and structures within the scope of these claims and their equivalents be covered thereby.

While operations are depicted in the drawings in a particular order, this is not to be construed as requiring that such operations be performed in the particular order shown or in sequential order, or that all illustrated operations be performed, to achieve the desirable results.

The subject matter of this specification has been described in terms of particular aspects, but other aspects can be implemented and are within the scope of the following claims. For example, the actions recited in the claims can be performed in a different order and still achieve desirable results. As one example, the process depicted in FIG. 10 does not necessarily require the particular order shown, or sequential order, to achieve desirable results. In certain implementations, multitasking and parallel processing may be advantageous. Other variations are within the scope of the following claims.

What is claimed is:

1. An integrated circuit (IC), comprising:
   a pair of inductors having a non-integer turn-ratio, the pair of inductors comprising:
      a primary inductor having a first width and a first length located on a first layer of the IC; and
      a secondary inductor having a second length located on a second layer of the IC different from the first layer, and the second length being greater than the first length with a ratio between the first and the second lengths that corresponds to the non-integer turn-ratio, wherein the secondary inductor further comprises two overlapping arms having second and third widths respectively that are less than the first width.

2. The IC of claim 1, wherein the primary inductor is confined within a perimeter on the first layer and the second inductor is confined within the same perimeter on the second layer.

3. The IC of claim 1, wherein the two overlapping arms of the secondary inductor are separated by one or more transient gaps.

4. The IC of claim 3, wherein a length of the one or more transient gaps between the two overlapping arms of the secondary inductor divided by the first length of the primary inductor corresponds to a transient gap fraction of the secondary inductor.

5. The IC of claim 3, wherein at least one of the one or more transient gaps has a fourth width, and the first width is equal to the sum of the second, the third, and the fourth widths.

6. The IC of claim 1, wherein the secondary inductor further comprises a first plurality of N conductors and a second plurality of N+1 conductors interconnected with conductor wires.

7. The IC of claim 6, wherein the non-integer turn-ratio of the pair of inductors is 1:m and the non-integer turn-ratio can be selected by fine-tuning a transient gap fraction of the secondary inductor, where N<m<N+1.

8. The IC of claim 1, wherein the primary inductor receives a pair of balanced signal inputs, and wherein the secondary inductor generates an unbalanced output.

9. The IC of claim 1, further comprising:
   another primary inductor located on the first layer, wherein the two primary inductors each receive a pair of inputs, and wherein the secondary inductor combines the pairs of inputs from the two primary inductors and generates a pair of outputs, the pair of outputs being proportional to the combined pairs of inputs.

10. An electronic device employing an integrated circuit (IC) configured with a pair of inductors, the device comprising:
   a primary inductor configured on a first layer of the IC, the primary inductor having a first width and a first length; and
   a secondary inductor configured on a second layer of the IC different from the first layer, the secondary inductor having a second length that is greater than the first length, and a ratio between the first and second lengths corresponding to a non-integer turn-ratio of the primary and secondary inductors, wherein the secondary inductor further comprises two overlapping arms having second and third widths respectively that are less than the first width.

* * * * *